United States Patent
Wang et al.

(10) Patent No.: US 11,430,534 B2
(45) Date of Patent: Aug. 30, 2022

(54) METHOD FOR TESTING STORAGE SYSTEMS, ELECTRONIC DEVICE, AND COMPUTER PROGRAM PRODUCT

(71) Applicant: EMC IP Holding Company LLC, Hopkinton, MA (US)

(72) Inventors: Hao Wang, Chengdu (CN); Xu Chen, Chengdu (CN); Pan Xiao, Chengdu (CN); Si Zhang, Chengdu (CN)

(73) Assignee: EMC IP Holding Company LLC, Hopkinton, MA (US)

( * ) Notice: Subject to any disclaimer, the term of this patent is extended or adjusted under 35 U.S.C. 154(b) by 0 days.

(21) Appl. No.: 17/196,309

(22) Filed: Mar. 9, 2021

(65) Prior Publication Data
US 2022/0172795 A1    Jun. 2, 2022

(30) Foreign Application Priority Data
Dec. 1, 2020    (CN) .......................... 202011385805.4

(51) Int. Cl.
*G11C 29/10*    (2006.01)
(52) U.S. Cl.
CPC ..................................... *G11C 29/10* (2013.01)
(58) Field of Classification Search
None
See application file for complete search history.

(56) References Cited

U.S. PATENT DOCUMENTS

| | | | | |
|---|---|---|---|---|
| 7,174,265 B2* | 2/2007 | Basham | .................. | G06F 11/26 |
| | | | | 702/122 |
| 8,001,443 B2* | 8/2011 | Lin | ........................ | G11C 29/16 |
| | | | | 714/763 |
| 8,418,000 B1* | 4/2013 | Salame | .................. | G06F 11/263 |
| | | | | 714/38.1 |
| 8,799,867 B1* | 8/2014 | Peri-Glass | .......... | G06F 11/3664 |
| | | | | 717/126 |
| 2004/0139191 A1* | 7/2004 | Chambliss | .............. | G06F 3/067 |
| | | | | 709/224 |
| 2004/0153618 A1 | 8/2004 | Wang et al. | | |
| 2020/0065234 A1* | 2/2020 | Letombe | ............. | G06F 11/3684 |

* cited by examiner

*Primary Examiner* — April Y Blair
*Assistant Examiner* — Matthew W Wahlin
(74) *Attorney, Agent, or Firm* — BainwoodHuang

(57) ABSTRACT

Techniques test a storage system. Such techniques involve: acquiring a result of performing a first test on the storage system using a test case; if the result indicates that the storage system fails the first test, performing a second test on the storage system based on a problem of the storage system; and if the result indicates that the storage system passes the first test, determining a security level of the test case based on the result. Such techniques can effectively enhance test performance and system reliability of the storage system.

20 Claims, 5 Drawing Sheets

METHOD FOR TESTING STORAGE SYSTEMS, ELECTRONIC DEVICE, AND COMPUTER PROGRAM PRODUCT

CROSS-REFERENCE TO RELATED APPLICATION

This application claims priority to Chinese Patent Application No. CN202011385805.4, on file at the China National Intellectual Property Administration (CNIPA), having a filing date of Dec. 1, 2020, and having "METHOD FOR TESTING STORAGE SYSTEMS, ELECTRONIC DEVICE, AND COMPUTER PROGRAM PRODUCT" as a title, the contents and teachings of which are herein incorporated by reference in their entirety.

TECHNICAL FIELD

Embodiments of the present disclosure generally relate to the field of storage systems, and more particularly, to a method, an electronic device, and a computer program product for testing a storage system.

BACKGROUND

In the storage system industry, customers often intend to increase the load on their storage systems. However, when operating under higher or extreme loads, the storage systems may become unreliable or even unusable. For example, modern storage systems may become unreliable under complex configurations, multiple workloads and system resource pressures, a large number of feature interactions, and unexpected single failure insertions. If the storage systems become unreliable, the storage systems may encounter many system-level problems during operations, such as system emergency, data unavailability or data loss (DUDL), significant performance degradation, etc.

When the customers of the storage systems encounter problems in complex scenarios, they are eager to understand how far they should load their systems, but this question is often difficult to answer. Because reliability is very different from functionality and simple performance metrics, it is difficult to determine reliability through a predefined test set.

SUMMARY OF THE INVENTION

The embodiments of the present disclosure provide a method, an electronic device, and a computer program product for testing a storage system.

In a first aspect of the present disclosure, a method for testing a storage system is provided. The method includes: acquiring a result of performing a first test on the storage system using a test case; if the result indicates that the storage system fails the first test, performing a second test on the storage system based on a problem of the storage system; and if the result indicates that the storage system passes the first test, determining a system safe level of the test case based on the result.

In a second aspect of the present disclosure, an electronic device is provided. The electronic device includes: at least one processing unit; and at least one memory coupled to the at least one processing unit and storing instructions for execution by the at least one processing unit which, when executed by the at least one processing unit, cause the electronic device to perform actions including: acquiring a result of performing a first test on a storage system using a test case; if the result indicates that the storage system fails the first test, performing a second test on the storage system based on a problem of the storage system; and if the result indicates that the storage system passes the first test, determining the system safe level of the test case based on the result.

In a third aspect of the present disclosure, a computer program product is provided. The computer program product is tangibly stored in a non-transitory computer storage medium and includes machine-executable instructions. The machine-executable instructions, when executed by a device, cause this device to implement any step of the method described according to the first aspect of the present disclosure.

The Summary of the Invention section is provided to introduce the selection of concepts in a simplified form, which will be further described in the Detailed Description below. The Summary of the Invention section is not intended to identify key features or essential features of the present disclosure, nor is it intended to limit the scope of the present disclosure.

BRIEF DESCRIPTION OF THE DRAWINGS

The above and other objectives, features, and advantages of the present disclosure will become more apparent by describing the example embodiments of the present disclosure in more detail in combination with the accompanying drawings. In the example embodiments of the present disclosure, the same reference numerals generally represent the same parts.

In each accompanying drawing, the same or corresponding numerals represent the same or corresponding parts.

DETAILED DESCRIPTION

Figure 1:
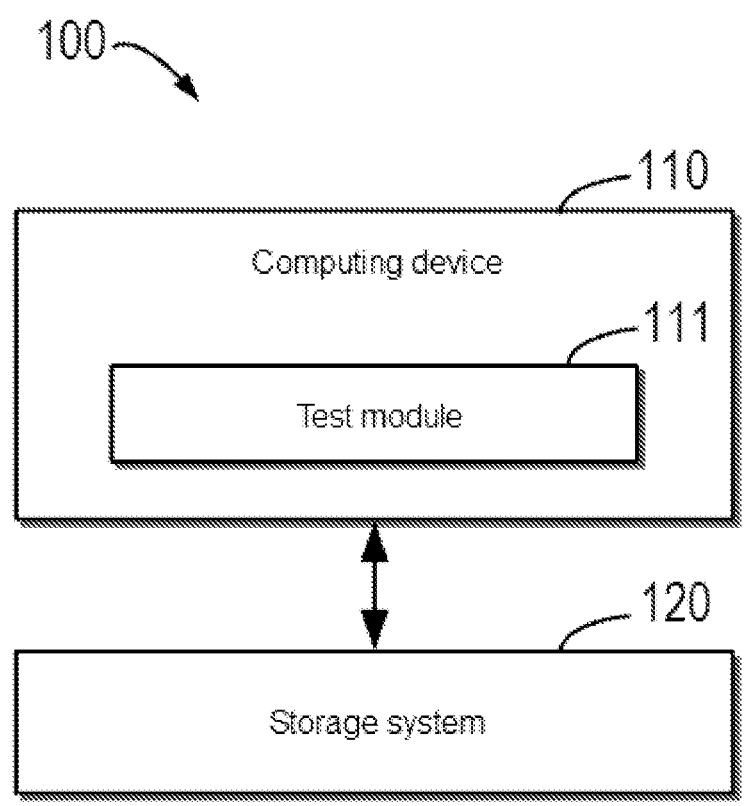
FIG. 1 shows a schematic diagram of an example environment in which an embodiment of the present disclosure can be implemented.

The individual features of the various embodiments, examples, and implementations disclosed within this document can be combined in any desired manner that makes technological sense. Furthermore, the individual features are hereby combined in this manner to form all possible combinations, permutations and variants except to the extent that such combinations, permutations and/or variants have been explicitly excluded or are impractical. Support for such combinations, permutations and variants is considered to exist within this document.

It should be understood that the specialized circuitry that performs one or more of the various operations disclosed herein may be formed by one or more processors operating in accordance with specialized instructions persistently stored in memory. Such components may be arranged in a variety of ways such as tightly coupled with each other (e.g., where the components electronically communicate over a computer bus), distributed among different locations (e.g., where the components electronically communicate over a computer network), combinations thereof, and so on.

Preferred embodiments of the present disclosure will be described in more detail below with reference to the accompanying drawings. Although the preferred embodiments of the present disclosure are shown in the accompanying drawings, it should be understood that the present disclosure can be implemented in various forms and should not be limited by the embodiments set forth herein. Rather, these embodiments are provided so that this disclosure will be more thorough and complete, and will fully convey the scope of the present disclosure to those skilled in the art.

As used herein, the term "including" and variations thereof mean open-ended inclusion, that is, "including but not limited to." Unless specifically stated, the term "or" means "and/or." The term "based on" means "based at least in part on." The terms "one example embodiment" and "one embodiment" mean "at least one example embodiment." The term "another embodiment" means "at least one further embodiment." The terms "first," "second," and the like, may refer to different or the same objects. Other explicit and implicit definitions may also be included below.

As mentioned above, when operating under higher or extreme loads, a storage system may become unreliable or even unusable. For example, modern storage systems may become unreliable under complex configurations, multiple workloads and system resource pressures, a large number of feature interactions, and unexpected single failure insertions. In this case, unexpected problems may occur, such as system emergency/restart, which may cause DUDL or a cliff-like decline in performance. When customers of the storage systems encounter problems in complex scenarios, they are eager to understand how far they should load their systems, but this question is often difficult to answer, even for researchers and developers. In many cases, when the customers encounter problems in complex scenarios, electronic engineers have to ask researchers and developers for help. This usually requires efforts of different test teams. For example, hundreds of system test scenarios are searched to check whether similar scenarios have been tested, or reproduction of the customers' scenarios on the test side is tried later to help investigate. Therefore, this technical field requires an effective and fast integration method for recording, summarizing, and comparing a large number of system test scenarios and customer scenarios.

The embodiments of the present disclosure provide a solution for testing a storage system to solve one or more of the above problems and other potential problems. According to the embodiments of the present disclosure, the storage system can be tested using a test case, and a safe level of the test case may be determined or the storage system may be retested according to a test result. A method for testing a storage system of the present disclosure can effectively improve the testing performance and system reliability of the storage system.

The embodiments of the present disclosure will be described in detail below with reference to FIG. 1 to FIG. 5. FIG. 1 shows a block diagram of example environment 100 in which the embodiments of the present disclosure can be implemented. As shown in FIG. 1, environment 100 includes computing device 110 and storage system 120. It should be understood that the structure of environment 100 is described only for illustrative purposes, and does not imply any limitation to the scope of the present disclosure.

For example, the embodiments of the present disclosure may also be applied to an environment different from environment 100.

Computing device 110 may be, for example, any physical computer, virtual machine, server, or the like where a user application is run. Storage system 120 may, for example, send a request to perform a test and scenario-based operating data to computing device 110, and/or receive test results for multiple test cases from computing device 110. In response to receiving a request to perform a test from storage system 120, computing device 110 may read scenario-based operating data from storage system 120. Storage device 120 may include any non-volatile storage medium currently known or to be developed in the future, such as a magnetic disk, a solid state disk (SSD), or a disk array.

Computing device 110 may perform a test on storage system 120 based on a plurality of test cases. For example, when computing device 110 receives a request to perform a test from storage system 120, computing device 110 may perform a test on storage system 120 based on a plurality of test cases, and then determine system safe levels of the test cases, and may provide test results to storage system 120. In addition, computing device 110 may also adjust the test cases based on the above test results, and accurately determine a system safe level of the test by extending or shrinking the scopes of the test cases.

In the embodiment shown in FIG. 1, computing device 110 may use test module 111 deployed therein to implement the foregoing test process and/or test case adjustment process. It should be understood that test module 111 is by way of example and not restrictive, and computing device 110 may also deploy other appropriate modules or components to implement the above-mentioned test.

The technical solution of the present disclosure can cover as many test cases as possible according to multiple predefined test scenario dimensions, so as to use a limited number (for example, hundreds) of tests to generate the safe levels (also called system safe boundaries) of the test cases. In this way, the solution not only can help technicians at a development side to improve system reliability at the development stage, but also can effectively reflect the system reliability of a client, especially when the system safe boundary of the storage system has been automatically updated from its early development stage to the release-to-manufacturing version (RTM version).

The technical solution of the present disclosure is based on testing the storage system, which is also called system testing. Testing the storage system needs to meet the following specific requirements. First of all, the system testing involved herein is realized by using multiple test cases. This test process is different from a functional test. The test cases are generated based on predefined test scenario dimensions. The test cases are based on scenarios, and each test scenario may include various input/output (IO) workloads, mixed use of features, mixed system operations, etc. It should be understood that herein, the test cases and test scenarios are used interchangeably.

Secondly, the attributes of the test scenarios usually involve concurrency, repetition, randomness, and long duration. In other words, when the test scenarios are generated, the attributes such as concurrency, repetition, randomness, and long duration usually need to be considered. The attribute of concurrency may increase the diversity and complexity of testing. A test scenario usually includes multiple features. When focusing on one of multiple features, what needs to be considered, for example, is that whether the existence of this feature will affect other features, whether the feature coexists with other features, and how customers want to use the feature, etc. The attribute of repetition refers to the repeated execution of an operation, such as turning on or off features, creating or deleting objects, extending and shrinking storage objects, etc. The attribute of randomness can broaden the coverage of products. For example, adding randomness to the test scenarios may include randomly changing the pattern of IO data, randomizing the schedule for starting and stopping test components, and randomizing operations for storage objects. The attribute of long duration relates to the execution time of the test scenarios, for example, the execution of the test scenarios usually lasts three to five days, or even more than a month.

In addition, the scope of each test case or test scenario should be extendable and/or shrinkable. This means that after passing the test multiple times, the scopes of the test cases or test scenarios may be extended and then tested again. If the test cannot be passed, or the test always fails, in certain aspects, the scopes of the test cases or test scenarios may be shrunk and then tested again.

The above has briefly introduced the conditions that the test cases or test scenarios usually need to meet. Next, various aspects of the technology of the present disclosure will be discussed in detail in conjunction with FIGS. 2 to 4.

Figure 2:
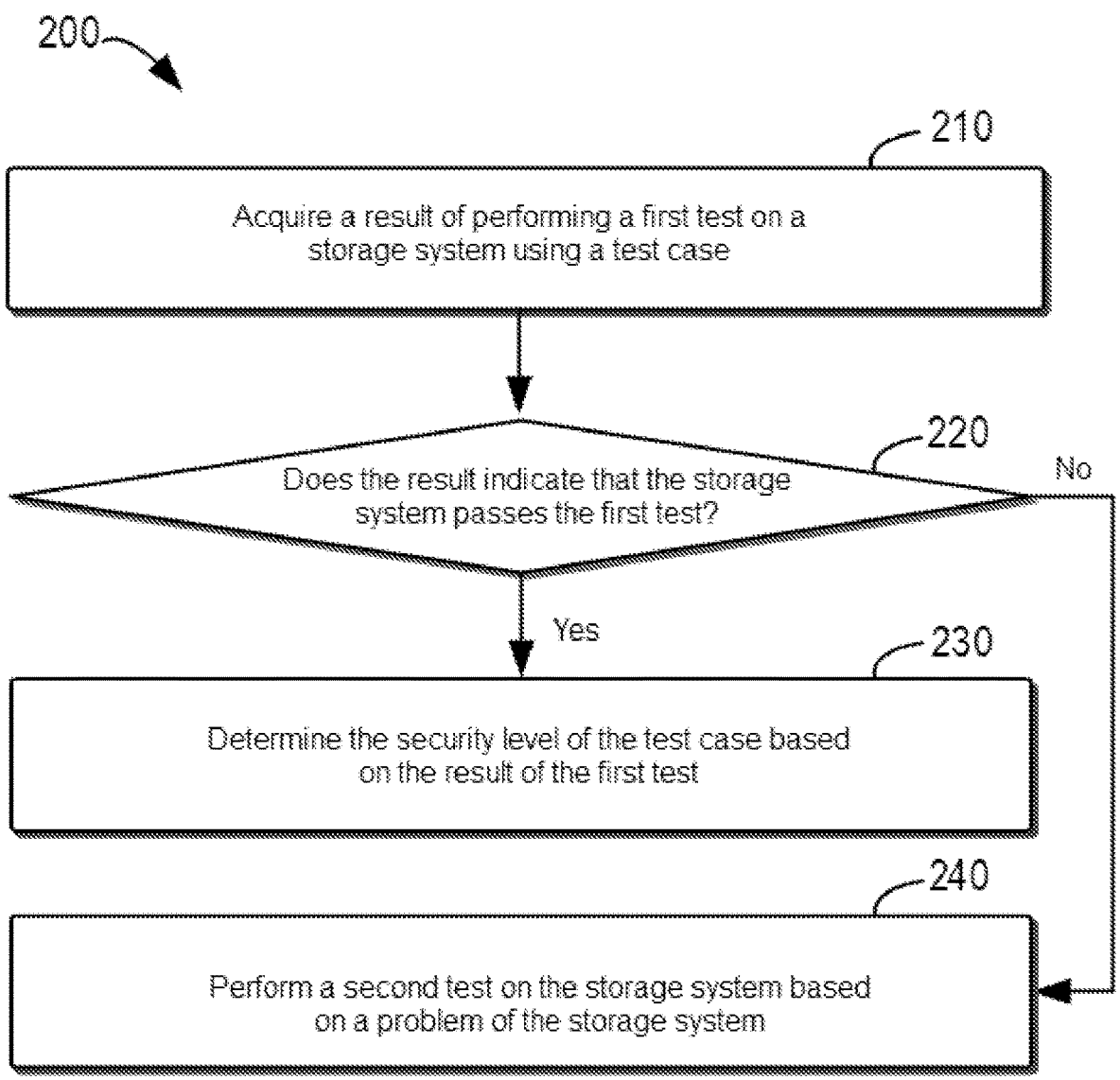
FIG. 2 shows a flowchart of an example method for testing a storage system according to an embodiment of the present disclosure.

FIG. 2 schematically shows a flowchart of example method 200 for testing a storage system according to an embodiment of the present disclosure. For example, method 200 may be performed by computing device 110 as shown in FIG. 1. It should be understood that method 200 may further include additional actions not shown and/or may omit actions shown, and the scope of the present disclosure is not limited in this regard. Method 200 is described in detail below with reference to FIG. 1.

At block 210, computing device 110 acquires a result (also referred to as a "first result" herein) of performing a first test on the storage system using a test case.

In some embodiments, in response to receiving a request to perform the test and scenario-based operating data from storage system 120, computing device 110 may first automatically generate a test case that is suitable for a specific scenario based on the scenario-based operating data received from storage system 120. Then, storage system 120 is tested by test module 111 using the test case. In some embodiments, as, for example, hundreds of system test cases are executed in test module 111, the result of each test is acquired, and then the test result is used for refinement, improvement, and re-run of the test cases in specific aspects (for example, in many test cycles). Computing device 110 may also obtain test cases suitable for specific scenarios from an existing test case library.

After comparing customer scenario usage data with system test conditions, multiple dimensions about the test scenarios can be defined, which are also called test scenario dimensions. For example, the embodiments of the present disclosure are described with reference to the following test scenario. The test scenario may have several independent dimensions, such as object configuration, external workload, system resource usage, and feature usage. These 4 dimensions are more commonly used. The test scenario may additionally include a dimension of filter factors. In the context of this disclosure, this is also referred to as 4+1 dimensions. It should be understood that the above test scenario and its dimension are by way of example rather than restrictive, and the embodiments of the present disclosure may also be implemented using other appropriate test scenarios and/or dimensions.

Storage systems usually have a huge variety of objects, such as drives, logical unit numbers (LUNs), file snapshots, copy sessions, migration sessions, online compression (ILC) objects/online deduplication (ILD) objects, etc. In the dimension of object configuration, these objects have system limits, that is, the values of these objects should fall within a range of [0, object limit value]. It should be understood that a configurable object means at least that the number of the object and/or the size of the object is configurable, in other words, the number of the object and/or the size of the object is extendable and/or shrinkable.

In the external workload dimension, the metrics of external workloads such as IO workloads and related loads loaded on the storage system should usually be defined by performance tests, such as bandwidths, input/output operations per second (IOPS), response time, etc.

The system resource usage dimension refers to the usage of system resources, including CPU utilization, operating system (OS) memory usage, system reserved memory usage, etc.

In the feature usage dimension, what is involved is the enabled or used features of the storage system, that is, security-related features, network-attached storage (NAS)-related features or operations, etc. It should be understood that these features are configurable, that is, at least the number of features and/or the size of the feature are/is configurable, and in other words, the number of features and/or the size of the feature are/is extendable and/or shrinkable.

Other factors that are difficult to categorize into the above four dimensions or other factors that are more suitable to be considered as filter factors are included in the "filter factor" dimension, such as models, specific TO parameters, etc.

It should be noted that the definition of each of the above dimensions is for the purpose of example and does not imply any limitation to the scope of the present disclosure. Likewise, each dimension has configurable features. This means that, in certain aspects, the configurable features in each dimension are extendable and/or shrinkable. In addition, it should be understood that for a specific test scenario, such as a real client storage system scenario (customer scenario), the features (sometimes referred to as items) in any of the above dimensions may be defined and used as needed to adapt to different testing needs. For example, for the object configuration dimension, all kinds of objects that customers want to interact with may be features in the test scenario.

In order to facilitate the comparison between the customer scenario usage data and the system test conditions, each feature in the test scenario may be standardized. As an example and not a limitation, the "the number of LUNs" in the object configuration dimension and "the total number of TOPS" in the external workload dimension are selected as two features/items in a test case or test scenario. For an item with a clear limit value, the limit value may be specified as 100. For example, if the system-defined limit of the item "the number of LUNs" is 2000, the number of LUNs may be standardized to be a score within the range [0, 100], where 2000 LUNs correspond to a score of 100, and 1000 LUNs correspond to a score of 50. For items that do not have a clearly defined limit, the maximum value may be specified as a score of 100. For example, if the item "the total number of TOPS" reaches the maximum value of 200,000, the total number of TOPS may be standardized to be a score within the range [0, 100], wherein the total number 200,000 of IOPS is a score corresponding to 100; and it should be noted that the item is updatable, that is, its maximum value is updatable. When a new maximum value is reached, the range of the score is also updated. It should be noted that the above standardization steps are not necessary, but for the convenience of description and intuitive comparison. The absence of the standardization steps or the use of different standardization methods will not affect the final comparison between the customer scenario usage data and the system test conditions, and thus will not affect the load recommendation for the customer system.

In some embodiments, for example, computing device 110 may classify and organize test results according to the test scenarios, such as collecting metric data of specific test scenario dimensions according to multiple dimensions of the test scenarios. For example, the test scenarios herein may have the above 4+1 independent dimensions. It should be understood that the specific test scenario dimensions are given for illustrative purposes only, and does not imply any limitation to the scope of the present disclosure.

At block 220, computing device 110 determines whether the result of performing the first test indicates that the storage system passes the first test. The "result" mentioned here may refer to, for example, whether specific features of the storage system survive in a specific scenario, whether the storage system passes the test, the safe level of the storage system, and so on.

At block 230, if the result indicates that the storage system passes the first test, computing device 110 determines the safe level of the test case based on the result of the first test.

In some embodiments, after storage system 120 passes the test for the test case, the features of the test case may be regarded as safe, and similarly, the features lower than those of the test case may be regarded as safe. In this way, the features that pass the test for the test case and are from the above 4+1 independent dimensions may be regarded as a system safe boundary, which is also called the system safe level. In addition, all metric data from the above 4+1 independent dimensions may be recorded for future comparison with specific user scenario data.

The following Table 1 shows an example of customer scenario data according to the technology herein. In this example, according to the features or items from the above 4+1 independent dimensions, as shown, after solving the problems in the storage system and possible other adverse effects, the storage system may survive when the following conditions are reached simultaneously. This means that the system safe boundary has been improved on the development side and detected by the system test side. In this case, the storage system may maintain reliability under the same or lower conditions, and the storage system may also be given greater pressure from this situation, such as adding more loads. Then, after adding more loads to the storage system based on the features or items of the 4+1 independent dimensions, a new test case is generated to determine whether the storage system is still reliable under the new test case, and if it is still reliable, a new safe level (system safe boundary) is determined. In this way, it is possible to predict the situation of specific data of a client. In other words, the technology of the present disclosure can provide a reasonable ability to recommend the system load of the client-side storage system, and even the ability to predict the reliability of the client-side storage system.

TABLE 1

Dimensional data of test scenarios for test cases of storage systems passing tests

| Dimension | Item | Value |
|---|---|---|
| Object configuration | Number of files | 1500 |
| | Number of file snapshots | 4000 + 500 (read/write file snapshots) |
| | Number of LUNs | 200 |
| External workload | bandwidth | 500 MB/s |
| | File IOPS | 10000 |
| | IO mode | Multiple |
| System resource | OS memory | 90% |
| Feature usage | Snapshot creation | 96 snapshots per file |
| | LUN migration | On 10 LUNs |
| Filter factor | Model | U480 |
| | Duration | 10 days |

At block 240, if the result indicates that the storage system has failed the first test, computing device 110 performs a second test on the storage system based on the problem of the storage system.

In some embodiments, if storage system 120 fails the test for the test case, it indicates that there may be some problems in storage system 120. In this case, a developer and/or tester may try to solve these problems, and then perform the second test on storage system 120 based on the problems existing in storage system 120. It should be understood that the problems existing in the storage system can be of various types. For example, system emergency, data unavailability or data loss (DUDL), significant performance degradation, cliff-like performance decline, etc. When a storage system has similar problems, the storage system should be understood as unreliable or even unusable.

Figure 3:
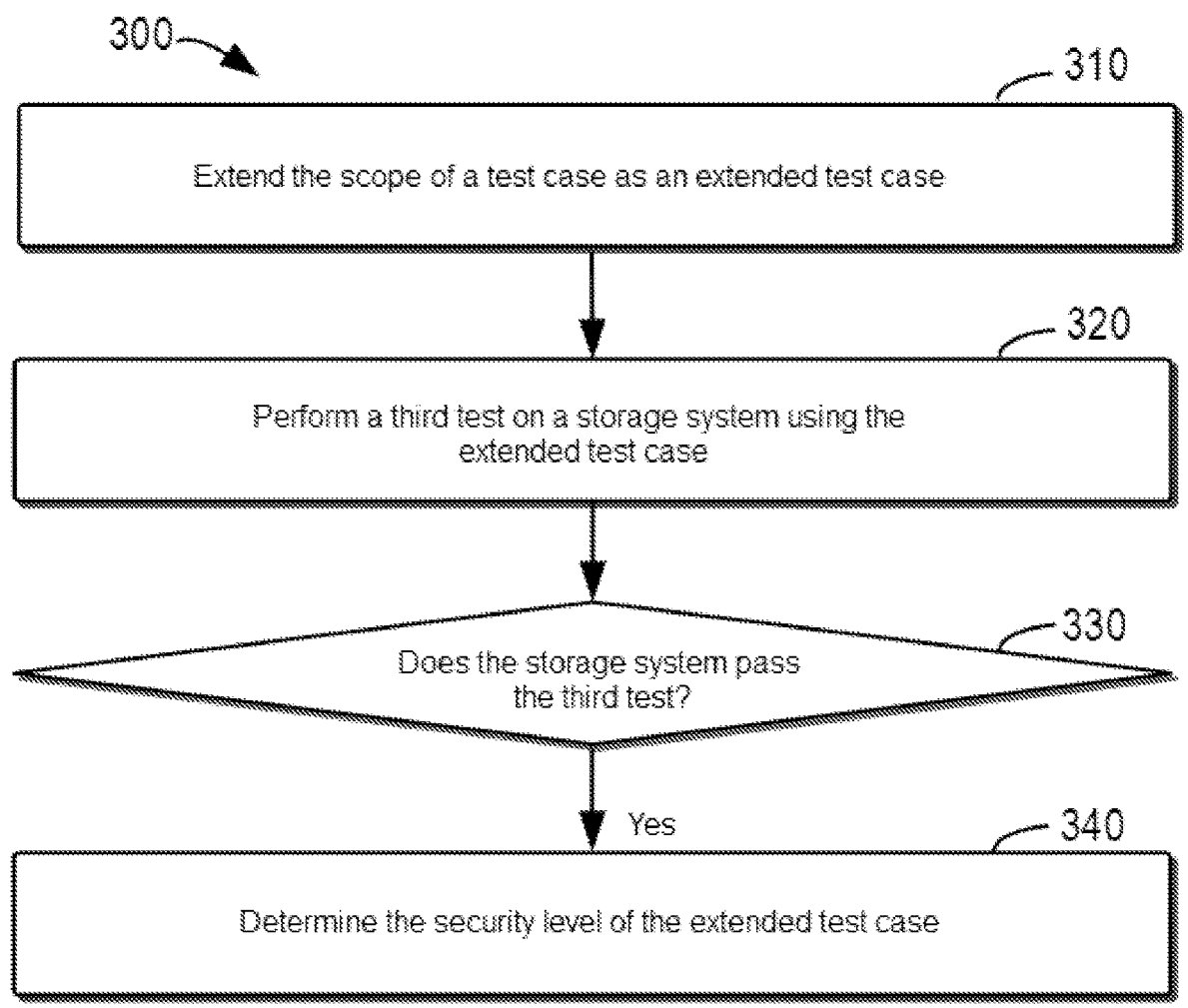
FIG. 3 shows a flowchart of an example method for extending a scope of a test case to determine a safe level according to an embodiment of the present disclosure.

FIG. 3 shows a flowchart of example method 300 for extending a scope of a test case to determine a safe level according to an embodiment of the present disclosure. Method 300 may be regarded as an example implementation of block 230 as shown in FIG. 2. According to some embodiments, method 300 may be performed by computing device 110 as shown in FIG. 1. In the case where it is determined that the result of the first test indicates that storage system 120 passes the first test, storage system 120 is safe under the test case, which means that the scope of the original test case is within the system safe boundary. On the other hand, in this case, the real system safe boundary is uncertain, and both the client and/or the tester need to understand to what extent the workload can be increased under the existing conditions. According to some embodiments, computing device 110 may implement method 300 to establish, adjust, and broaden the system safe boundary.

At block 310, computing device 110 extends the scope of the test case as an extended test case.

As mentioned earlier, the scope of each test case or test scenario should be extendable and/or shrinkable. For example, but without limitation, extending the scope of the test case may include increasing the number of features or items included in the test case, increasing the size of the features or items, adding new features or items to the test case, and adding new test steps or the order of test sequences, etc. according to the tester's design purpose.

At block 320, computing device 110 performs a third test on storage system 120 using the extended test case. Then, at block 330, computing device 110 determines whether storage system 120 passes the third test. If the third test is passed, computing device 110 determines the safe level of the extended test case at block 340. In this way, the safe level of the extended test case can cover more features or items than the safe level of the original test case does, thereby improving the system safe boundary. In other words, under the safe level of the extended test case, storage system 120 may bear more system pressure or workloads. Similarly, the test case may be further extended and then used to perform tests on the storage system according to the technology of the present disclosure to determine a safe boundary with a wider coverage.

Figure 4:
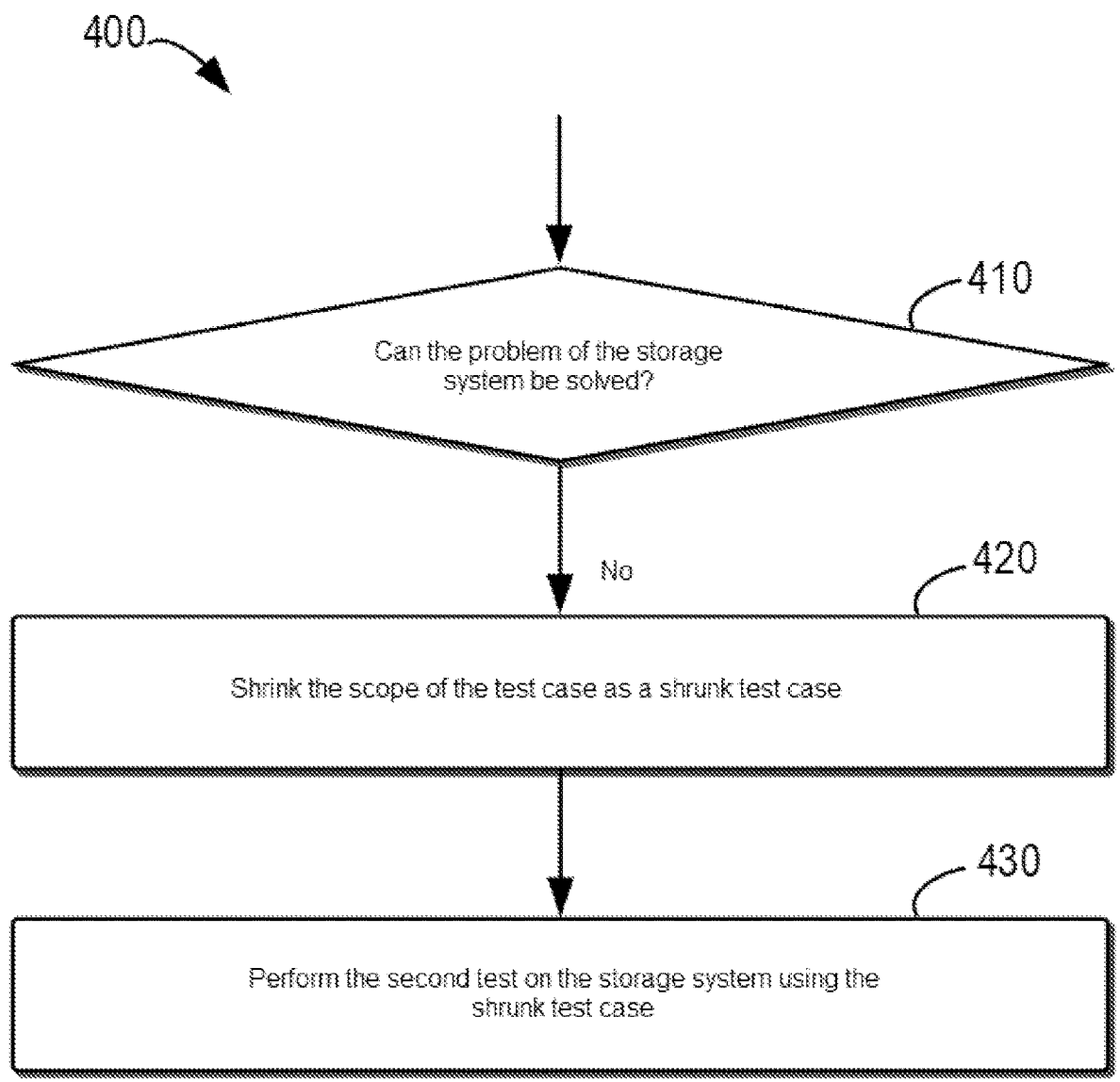
FIG. 4 shows a flowchart of an example method for shrinking a scope of a test case to perform a test on a storage system according to an embodiment of the present disclosure.

FIG. 4 shows a flowchart of example method 400 for shrinking a scope of a test case to perform a test on a storage system according to an embodiment of the present disclosure. Method 400 may be regarded as an example implementation of block 240 as shown in FIG. 2. According to some embodiments, method 400 may be performed by computing device 110 as shown in FIG. 1. In the case where it is determined that the result of the first test indicates that storage system 120 has failed the first test, storage system 120 is unreliable and/or unsafe under the test case, which means that the scope of the original test case exceeds the system safe boundary in certain aspects. In this case, both the client and/or the tester need to understand which aspects of the workload and/or other factors are the main reasons for the problems of storage system 120. According to some embodiments, computing device 110 may implement method 400 to solve the problems in storage system 120 and adjust, reduce, improve, and increase the system safe boundary.

In some cases, storage system 120 is subjected to too much workloads and becomes unreliable or even unavailable, such as the system emergency, data unavailability or data loss (DUDL), significant performance degradation, and cliff-like decline in performance described above. As shown in FIG. 4, at block 410, computing device 110 determines whether the problem of storage system 120 can be solved. If, for example, the workload is too much, and the problem of the storage system cannot be solved, then block 420 is performed. At block 420, computing device 110 shrinks the scope of the test case as a shrunk test case.

As mentioned earlier, the scope of each test case or test scenario should be extendable and/or shrinkable. For example, but without limitation, shrinking the scope of the test case may include reducing the number of features or items included in the test case, reducing the size of the features or items, deleting the features or items in the test case, and reducing test steps or the order of test sequences, etc. according to the tester's design purpose.

Then, at block 430, computing device 110 performs the second test on storage system 120 using the shrunk test case. In this way, the safe level of the shrunk test case covers fewer features or items than the safe level of the original test case does, thereby reducing the system safe boundary. In other words, under the safe level of the shrunk test case, storage system 120 becomes safer, or more reliable, because it bears less system pressure or workloads. Similarly, the test case may be further shrunk and then used to perform tests on the storage system according to the technology of the present disclosure to ensure the reliability and safety of the storage system within the safe boundary.

According to some embodiments, if block 410 of FIG. 4 indicates that the problem of storage system 120 can be solved, computing device 110 may use the test case to perform the second test on storage system 120 after the problem is solved. It should be understood that regardless of whether the above-mentioned problems of storage system 120 can be solved, the environment of the test case has changed.

The technology of the present disclosure can effectively detect the system safe boundary, accordingly improve the system test process to determine the system reliability, and provide load recommendations for customer application scenarios. There can be many methods to match the customer scenario and the recorded system test scenarios, as shown in Table 2 below, but the methods shown are only examples and not limitations. It should be understood that these comparison methods can be used alone or in combination.

TABLE 2

Methods of comparing customer scenario and recorded system test scenarios

| Comparison methods | Description |
|---|---|
| Full coverage first | Give priority to finding an item with the highest score in recorded test scenarios |
| Most similar first | Give priority to finding items with the most similar scores in recorded test scenarios |
| Specific dimension first | Give priority to finding an item with the highest priority defined by a user in recorded test scenarios |

In addition, after using the methods in Table 2 to compare the customer scenario and the recorded system test scenarios, there may be different matching results, as shown in Table 3 below.

TABLE 3

Analysis of matching results between customer scenario and recorded system test scenarios

| Matching results | Description |
|---|---|
| Customer scenario is completely covered | A storage system of a customer is within a safe load range, and the customer can improve a system safe boundary based on the matching result. |
| A few items in customer scenario are not covered | A storage system of a customer may be at risk of instability or unreliability, and the risk can be determined based on the total score of the storage system in multiple dimensions. On the other hand, a tester can improve system performance based on the matching result and recommend customer scenario in a better way. |
| Most items in customer scenario are not covered | A storage system of a customer is at a higher risk of instability or unreliability and needs to be adjusted as soon as possible. |

According to some embodiments, in the matching and/or comparison between the customer scenario and the recorded system test scenarios, one or more items or features may exceed the original system safe boundary. Using the technology of the present disclosure, after the scope of the current test case (TS) is extended to the extended test case (TS+), as shown in block 310 of FIG. 3, the extended test case will be recorded. As shown in Table 4 below, matches of multiple items from 4+1 dimensions are listed. It should be appreciated that multiple items in Table 4 are listed by way of example and do not imply any limitation to the scope of the disclosure. For example, items from the dimension "object configuration" may also include "the number of LUNs," items from "external workload" may also include an "IO mode," and items from the dimension "feature usage" may also include "snapshot creation" and "LUN migration" and so on.

As shown in Table 4 below, from the current test case TS to the extended test case TS+, only the item "number of file snapshots" is increased from 3800 to 4000, "OS memory" is increased from 90% to 92%, and "NAS module reserved (PNAS) memory" is increased from 85% to 90% while other items are kept unchanged. Compared with the customer scenario data, the above three items all fall within the scopes of the current test case TS and the extended test case TS+, in other words, fall under their system safe boundaries. It should be noted that the item "multi-user" in the customer scenario data far exceeds the safe boundaries of the current test case TS and the extended test case TS+. Therefore, the "multi-user" item has a gap between the user scenarios and the test cases, and the tester should extend the scope of corresponding test cases to fill the gap. It should be understood that the examples of comparison between the customer scenarios and the recorded system test scenarios are described for illustrative purposes only and do not imply any limitation to the scope of the present disclosure. In this way, the technology of the present disclosure can continuously refine and improve the system test scenarios during the research and development phase to find, establish, adjust, and broaden the system safe boundary.

TABLE 4

A typical example of comparison between customer scenario and recorded system test scenarios

| Dimension | Item | TS value | TS score | TS+ value | TS+ score | Client name | Client score |
|---|---|---|---|---|---|---|---|
| Object configuration | Number of files | 1500 | 100 | 1500 | 100 | 500 | 25 |
| | Number of file snapshots | 3800 | 95 | 4000 | 100 | 3000 | 75 |
| | ... | ... | ... | ... | ... | ... | ... |
| External workload | Bandwidth | 1000 MB/s | 80 | 1000 MB/s | 80 | 800 MB/s | 64 |
| | File IOPS | 30000 | 50 | 30000 | 50 | 27000 | 45 |
| | ... | ... | ... | ... | ... | ... | ... |
| System resource | OS memory | 90% | 90 | 92% | 92 | 80% | 80 |
| | PNAS memory | 85% | 85 | 90% | 90 | 75% | 75 |
| | ... | ... | ... | ... | ... | ... | ... |
| Feature usage | Multi-user | 10 | 2 | 10 | 2 | 10000 | 80 |
| | FIPS | Enable | 100 | Enable | 100 | Enable | 100 |
| | ... | ... | ... | ... | ... | ... | ... |
| Filter factor | Model | U480 | U480 | U480 | The same | U480 | The same |
| | Duration | 5 days | 100 | 5 days | 100 | 5 days | 100 |
| | ... | ... | ... | ... | ... | ... | ... |

Figure 5:
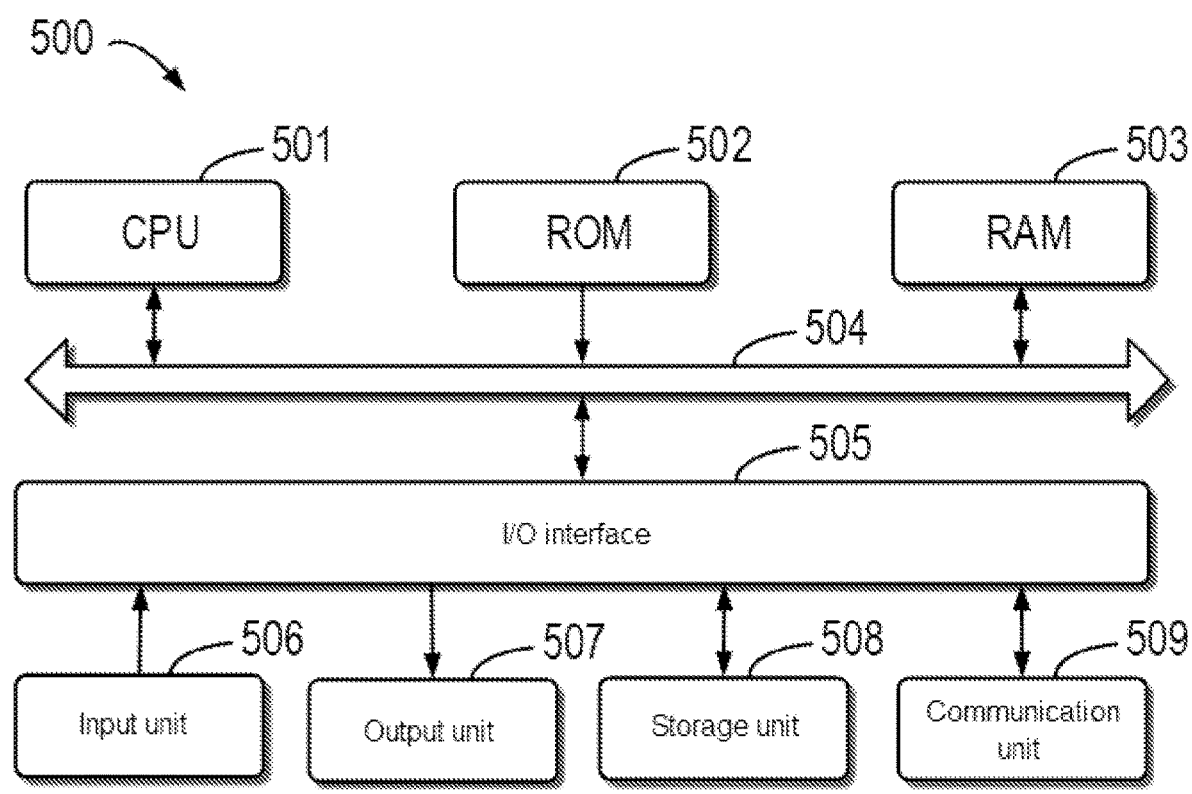
FIG. 5 shows a schematic block diagram of an example device that can be configured to implement embodiments of the present disclosure.

FIG. 5 illustrates a schematic block diagram of example device 500 that can be used to implement the embodiments of the content of the present disclosure. For example, computing device 110 as shown in FIG. 1 may be implemented by electronic device 500. As shown in FIG. 5, device 500 includes Central Processing Unit (CPU) 501 that may execute various appropriate actions and processing in accordance with computer program instructions stored in read-only memory (ROM) 502 or computer program instructions loaded onto random access memory (RAM) 503 from storage unit 508. In RAM 503, various programs and data required for the operation of device 500 may also be stored. CPU 501, ROM 502, and RAM 503 are connected to each other through bus 504. Input/output (I/O) interface 505 is also connected to bus 504.

Multiple components in device 500 are connected to I/O interface 505, including: input unit 506, such as a keyboard and a mouse; output unit 507, such as various types of displays and speakers; storage unit 508, such as a magnetic disk and an optical disk; and communication unit 509, such as a network card, a modem, and a wireless communication transceiver. Communication unit 509 allows device 500 to exchange information/data with other devices through a computer network such as the Internet and/or various telecommunication networks.

The various processes and processing described above, such as methods 200, 300, and/or 400, may be performed by processing unit 501. For example, in some embodiments, methods 200, 300, and/or 400 may be implemented as a computer software program that is tangibly included in a machine-readable medium, such as storage unit 508. In some embodiments, part or all of the computer program may be loaded and/or installed to device 500 via ROM 502 and/or communication unit 509. When the computer program is loaded to RAM 503 and executed by CPU 501, one or more actions of methods 200, 300, and/or 400 described above may be executed.

The present disclosure may be a method, an electronic device, a system, and/or a computer program product. The computer program product may include a computer-readable storage medium on which computer-readable program instructions for performing various aspects of the present disclosure are loaded.

The computer-readable storage medium may be a tangible device that may retain and store instructions for use by an instruction-executing device. For example, the computer-readable storage medium may be, but is not limited to, an electrical storage device, a magnetic storage device, an optical storage device, an electromagnetic storage device, a semiconductor storage device, or any appropriate combination thereof. More specific examples (a non-exhaustive list) of the computer-readable storage medium include: a portable computer disk, a hard disk drive, a random access memory (RAM), a read-only memory (ROM), an erasable programmable read-only memory (EPROM or flash memory), a static random access memory (SRAM), a portable compact disk read-only memory (CD-ROM), a digital versatile disk (DVD), a memory stick, a floppy disk, a mechanical encoding device such as a punch card or a raised structure in a groove having instructions stored thereon, and any appropriate combination thereof. Computer-readable storage media used herein are not to be interpreted as transient signals per se, such as radio waves or other freely propagating electromagnetic waves, electromagnetic waves propagating through waveguides or other transmission media (for example, light pulses through fiber optic cables), or electrical signals transmitted via electrical wires.

The computer-readable program instructions described herein may be downloaded from a computer-readable storage medium to various computing/processing devices or downloaded to an external computer or external storage device via a network, such as the Internet, a local area network, a wide area network, and/or a wireless network. The network may include copper transmission cables, fiber optic transmission, wireless transmission, routers, firewalls, switches, gateway computers, and/or edge servers. A network adapter card or network interface in each computing/processing device receives computer-readable program instructions from the network and forwards the computer-readable program instructions for storage in the computer-readable storage medium in each computing/processing device.

Computer program instructions for performing the operations of the present disclosure may be assembly instructions, instruction set architecture (ISA) instructions, machine instructions, machine-related instructions, microcode, firmware instructions, state setting data, or source code or object code written in any combination of one or more programming languages, wherein the programming languages include object-oriented programming languages, such as Smalltalk and C++, and conventional procedural programming languages, such as the "C" language or similar programming languages. The computer-readable program instructions may be executed entirely on a user's computer, partly on a user's computer, as a stand-alone software package, partly on a user's computer and partly on a remote computer, or entirely on a remote computer or a server. In cases where a remote computer is involved, the remote computer may be connected, through any type of network—including a local area network (LAN) or a wide area network (the WAN)—to a user computer, or may be connected to an external computer (e.g., connected through the Internet using an Internet service provider). In some embodiments, an electronic circuit, for example, a programmable logic circuit, a field programmable gate array (FPGA), or a programmable logic array (PLA), is personalized by utilizing state information of the computer-readable program instructions, wherein the electronic circuit may execute computer-readable program instructions so as to implement various aspects of the present disclosure.

Various aspects of the present disclosure are described herein with reference to flowcharts and/or block diagrams of the method, the electronic device (system), and the computer program product according to embodiments of the present disclosure. It should be understood that each block in the flowcharts and/or block diagrams as well as a combination of blocks in the flowcharts and/or block diagrams may be implemented using computer-readable program instructions.

These computer-readable program instructions can be provided to a processing unit of a general-purpose computer, a special-purpose computer, or a further programmable data processing electronic device, thereby producing a machine, such that these instructions, when executed by the processing unit of the computer or the further programmable data processing electronic device, produce electronic devices for implementing functions/actions specified in one or more blocks in the flowcharts and/or block diagrams. These computer-readable program instructions may also be stored in a computer-readable storage medium, and these instructions cause a computer, a programmable data processing electronic device, and/or other devices to operate in a specific manner; and thus the computer-readable medium having instructions stored includes an article of manufacture that includes instructions that implement various aspects of the functions/actions specified in one or more blocks in the flowcharts and/or block diagrams.

The computer-readable program instructions may also be loaded to a computer, a further programmable data processing electronic device, or a further device, so that a series of operating steps may be performed on the computer, the further programmable data processing electronic device, or the further device to produce a computer-implemented process, such that the instructions executed on the computer, the further programmable data processing electronic device, or the further device may implement the functions/actions specified in one or more blocks in the flowcharts and/or block diagrams.

The flowcharts and block diagrams in the drawings illustrate the architectures, functions, and operations of possible implementations of the systems, methods, and computer program products according to various embodiments of the present disclosure. In this regard, each block in the flowcharts or block diagrams may represent a module, a program segment, or part of an instruction, the module, program segment, or part of an instruction including one or more executable instructions for implementing specified logical functions. In some alternative implementations, functions marked in the blocks may also occur in an order different from that marked in the accompanying drawings. For example, two successive blocks may actually be executed in parallel substantially, or they may be executed in an opposite order sometimes, depending on the functions involved. It should be further noted that each block in the block diagrams and/or flowcharts as well as a combination of blocks in the block diagrams and/or flowcharts may be implemented using a special hardware-based system that executes specified functions or actions, or using a combination of special hardware and computer instructions.

Various embodiments of the present disclosure have been described above. The foregoing description is illustrative rather than exhaustive, and is not limited to the disclosed embodiments. Numerous modifications and alterations are apparent to those of ordinary skill in the art without departing from the scope and spirit of the illustrated embodiments. The selection of terms used herein is intended to best explain the principles and practical applications of the embodiments or technical improvements to technologies in the market, or to enable other persons of ordinary skill in the art to understand the embodiments disclosed herein.

The invention claimed is:

1. A method of determining and indicating whether a storage system can reliably execute a customer scenario having respective values for corresponding dimensions of operation, comprising:
   executing a plurality of test cases on the storage system, each test case being reliably executed by the storage system and having a corresponding pattern of values for the dimensions of operation, and for each test case recording corresponding test case data including the pattern of values;
   comparing the customer scenario to the recorded test case data for the test cases to identify one or more test cases whose patterns of values are similar to a pattern of values of the customer scenario; and calculating a coverage for the customer scenario based on the identified similar test cases, and generating a corresponding reliability output based on the calculated coverage, the reliability output being selected from (1) a safe output generated when the customer scenario is fully covered in all dimensions by the identified similar test cases, the safe output indicating that the storage system can reliably execute the customer scenario, and (2) a non-safe output generated when the customer scenario is not covered in most of the dimensions by the identified similar test cases, the non-safe output indicating that the storage system cannot reliably execute the customer scenario, wherein executing the plurality of test cases includes:
acquiring a result of performing a first test on the storage system using a test case;
if the result indicates that the storage system fails the first test, performing a second test on the storage system based on a problem of the storage system; and
if the result indicates that the storage system passes the first test, determining a security level of the test case based on the result, and wherein performing the second test on the storage system based on the problem of the storage system comprises: if the problem of the storage system can be solved, performing the second test on the storage system using the test case after the problem is solved.

2. The method according to claim 1, further comprising:
if the result indicates that the storage system passes the first test, extending a scope of the test case as an extended test case;
performing a third test on the storage system using the extended test case; and
if the storage system passes the third test, determining a security level of the extended test case.

3. The method according to claim 2, wherein extending the scope of the test case comprises at least one of the following:
increasing the number of features included in the test case; and
increasing the size of the features.

4. The method according to claim 1, wherein performing the second test on the storage system based on the problem of the storage system comprises:
if the problem of the storage system cannot be solved, shrinking the scope of the test case as a shrunk test case, and
performing the second test on the storage system using the shrunk test case.

5. The method according to claim 4, wherein shrinking the scope of the test case comprises at least one of the following:
reducing the number of the features included in the test case; and
reducing the size of the features.

6. The method according to claim 1, wherein the test case is generated based on a predefined test scenario dimension.

7. The method according to claim 1, wherein the reliability output is further selected from (3) an intermediate output generated when the customer scenario is covered in some but not all the dimensions by the identified similar test cases, the intermediate output indicating that the storage system can execute the customer scenario with risk of unreliability.

8. The method according to claim 1, wherein the dimensions include an object configuration dimension, an external workload dimension, a system resource dimension, and a feature usage dimension.

9. The method according to claim 8, wherein:
the object configuration dimension relates to numbers and sizes for logical storage objects relative to system limits, the logical storage objects including one or more of drives, logical unit numbers (LUNs), file snapshots, copy sessions, migration sessions, online compression (ILC) objects/online deduplication (ILD) objects;
the external workload dimension relates to metrics for IO workloads and related loads on the storage system defined by performance tests, including one or more of data bandwidth, input/output operations per second (IOPS), and response time;
the system resource usage dimension relates to one or more of CPU utilization, operating system (OS) memory usage, and system reserved memory usage; and
the feature usage dimension relates to enabled or used features of the storage system including one or more of security-related features, and network-attached storage (NAS)-related features.

10. The method according to claim 1, further including generating a load recommendation output based on the calculated coverage, the load recommendation output indicating whether additional workload could be added to the customer scenario while maintaining reliable execution of the customer scenario by the storage system.

11. An electronic device, comprising:
at least one processing unit; and
at least one memory coupled to the at least one processing unit and storing instructions for execution by the at least one processing unit, wherein the instructions, when executed by the at least one processing unit, cause the electronic device to perform actions, the actions comprising:
executing a plurality of test cases on a storage system, each test case being reliably executed by the storage system and having a corresponding pattern of values for corresponding dimensions of operation, and for each test case recording corresponding test case data including the pattern of values;
comparing a customer scenario to the recorded test case data for the test cases to identify one or more test cases whose patterns of values are similar to a pattern of values of the customer scenario; and
calculating a coverage for the customer scenario based on the identified similar test cases, and generating a corresponding reliability output based on the calculated coverage, the reliability output being selected from (1) a safe output generated when the customer scenario is fully covered in all dimensions by the identified similar test cases, the safe output indicating that the storage system can reliably execute the customer scenario, and (2) a non-safe output generated when the customer scenario is not covered in most of the dimensions by the identified similar test cases, the non-safe output indicating that the storage system cannot reliably execute the customer scenario,
wherein executing the plurality of test cases includes:
acquiring a result of performing a first test on the storage system using a test case;

if the result indicates that the storage system fails the first test, performing a second test on the storage system based on a problem of the storage system; and if the result indicates that the storage system passes the first test, determining a security level of the test case based on the result, and wherein performing the second test on the storage system based on the problem of the storage system comprises: if the problem of the storage system can be solved, performing the second test on the storage system using the test case after the problem is solved.

12. The electronic device according to claim 11, wherein the actions further comprise:

if the result indicates that the storage system passes the first test, extending a scope of the test case as an extended test case;

performing a third test on the storage system using the extended test case; and if the storage system passes the third test, determining a security level of the extended test case.

13. The electronic device according to claim 12, wherein extending the scope of the test case comprises at least one of the following:

increasing the number of features included in the test case; and increasing the size of the features.

14. The electronic device according to claim 11, wherein performing the second test on the storage system based on the problem of the storage system comprises:

if the problem of the storage system cannot be solved, shrinking the scope of the test case as a shrunk test case, and performing the second test on the storage system using the shrunk test case.

15. The electronic device according to claim 14, wherein shrinking the scope of the test case comprises at least one of the following:

reducing the number of the features included in the test case; and reducing the size of the features.

16. The electronic device according to claim 11, wherein the test case is generated based on a predefined test scenario dimension.

17. The electronic device according to claim 11, wherein the reliability output is further selected from (3) an intermediate output generated when the customer scenario is covered in some but not all the dimensions by the identified similar test cases, the intermediate output indicating that the storage system can execute the customer scenario with risk of unreliability.

18. The electronic device according to claim 11, wherein the dimensions include an object configuration dimension, an external workload dimension, a system resource dimension, and a feature usage dimension.

19. The electronic device according to claim 18, wherein:

the object configuration dimension relates to numbers and sizes for logical storage objects relative to system limits, the logical storage objects including one or more of drives, logical unit numbers (LUNs), file snapshots, copy sessions, migration sessions, online compression (ILC) objects/online deduplication (ILD) objects;

the external workload dimension relates to metrics for IO workloads and related loads on the storage system defined by performance tests, including one or more of data bandwidth, input/output operations per second (IOPS), and response time;

the system resource usage dimension relates to one or more of CPU utilization, operating system (OS) memory usage, and system reserved memory usage; and the feature usage dimension relates to enabled or used features of the storage system including one or more of security-related features, and network-attached storage (NAS)-related features.

20. The electronic device according to claim 11, wherein the actions further include generating a load recommendation output based on the calculated coverage, the load recommendation output indicating whether additional workload could be added to the customer scenario while maintaining reliable execution of the customer scenario by the storage system.

* * * * *